US006788984B2

(12) United States Patent
Plotkin

(10) Patent No.: US 6,788,984 B2
(45) Date of Patent: Sep. 7, 2004

(54) CONTAINER DESIGN PROCESS

(75) Inventor: Jon K. Plotkin, Powder Springs, GA (US)

(73) Assignee: The Coca-Cola Company, Atlanta, GA (US)

( * ) Notice: Subject to any disclaimer, the term of this patent is extended or adjusted under 35 U.S.C. 154(b) by 477 days.

(21) Appl. No.: 09/776,623

(22) Filed: Feb. 2, 2001

(65) Prior Publication Data

US 2002/0107598 A1 Aug. 8, 2002

(51) Int. Cl.⁷ .............................................. G06F 19/00
(52) U.S. Cl. .......................... 700/97; 700/98; 700/118; 703/1
(58) Field of Search ...................... 703/1, 6, 7; 702/172, 702/155; 220/62.12, 62.11, 906, 495.03, 592.16, 592.17; 700/182, 97, 98, 118, 117; 73/776, 865.8, 760, 804; 356/239.4

(56) References Cited

U.S. PATENT DOCUMENTS

| | | | |
|---|---|---|---|
| 4,852,415 | * 8/1989 | Bogatzki et al. | 73/865.8 |
| 5,425,279 | * 6/1995 | Clark et al. | 73/865.8 |
| 5,458,825 | * 10/1995 | Grolman et al. | 264/401 |
| 5,591,899 | * 1/1997 | Griesbeck | 73/41 |
| 5,684,713 | * 11/1997 | Asada et al. | 716/19 |
| 5,690,490 | * 11/1997 | Cannon et al. | 433/141 |
| 5,742,511 | * 4/1998 | Chasse et al. | 700/98 |
| 5,837,170 | * 11/1998 | Valyi | 264/40.1 |
| 6,042,757 | * 3/2000 | Abe et al. | 264/28 |
| 6,064,759 | * 5/2000 | Buckley et al. | 382/154 |
| 6,473,169 | * 10/2002 | Dawley et al. | 356/239.4 |
| 6,640,149 | * 10/2003 | Nardini et al. | 700/117 |
| 2002/0072884 | * 6/2002 | El-Ratal | 703/2 |
| 2002/0077795 | * 6/2002 | Woods et al. | 703/6 |

OTHER PUBLICATIONS

Mechanical Engineering Magazine, vol. 118/No. 6 Jun. 1996, Advertisement for "Finite Element Modeling" by Dr. Constantine Spyrakos of West Virginia University, published by Algor, Inc. of Pittsburgh, Pennsylvania (Publishing Division).
Mechanical Engineering Magazine, vol. 122/No. 12 Dec. 2000, Advertisement for "Learn FEA At Your Deskstop By Webcasting", published by Algor, Inc. of Pittsburgh, Pennsylvania.
Mechanical Engineering Magazine, vol. 122/No. 12 Dec. 2000, advertising for "Houdini" software published by Algor, Inc. of Pittsburgh, Pennsylvania.
Mechanical Engineering Magazine, vol. 118/No. 6 Jun. 1996, Advertisement for "ADINA and Pro/Engineer" software published by Algor, Inc. of Pittsburgh, Pennsylvania.

* cited by examiner

Primary Examiner—Leo Picard
Assistant Examiner—Alexander Kosowski
(74) Attorney, Agent, or Firm—Sutherland Asbill & Brennan LLP

(57) ABSTRACT

A container design process. The process involves receiving container design specifications, receiving readings from a first scan of a container taken before the container has been exposed to expected conditions of use, receiving readings from a second scan of the container taken after the container has been exposed to the expected conditions of use, applying finite element analysis to the container using measurements obtained by comparing the first scan and the second scan, and recommending design changes that will enable the container to meet the container design specifications based on the finite element analysis.

26 Claims, 2 Drawing Sheets

CONTAINER DESIGN PROCESS

FIELD OF THE INVENTION

The invention relates generally to container manufacturing methods and, more particularly, relates to a container design process.

BACKGROUND OF THE INVENTION

In the typical container design process, a graphic artist first sketches a container concept. Using CAD/CAM software, an engineer may then translate those sketches into a container design drawing that indicates actual container measurements. In a manner well known to those skilled in the art, the engineer may then prepare a mold corresponding to the container design drawings. The engineer may then form the container using the mold so as to test the container under the expected conditions of use.

Typically, early prototypes of the container do not meet the design specifications or the objective for handling the expected conditions of use. For example, exposing the container to these expected conditions of use may deform the container. Several rounds of failure may be expected until the container design is optimized.

If the container does not meet the design specifications for handling the expected conditions of use, the engineer may then visually examine the container. The engineer may make an educated guess about how to modify the container design drawings in order to produce a container that meets, or more closely meets, the design specifications. The engineer also may turn to finite element analysis to determine how to modify the container geometry and drawings. Although the engineer may at this point use finite element analysis, to date there has been no simple method by which the engineer can obtain the actual measurements to use in the finite element analysis equations. Rather, the engineer often just estimates these numbers.

The engineer may then repeat the process of producing a mold (this time corresponding to the modified container design drawings), making the container using the mold, and then testing the container under the expected conditions of use to determine if the container meets the design specifications. Because of the inefficiency in this trial and error process of designing a container and resolving geometry failures, producing a container that meets the design specifications often requires many iterations of this process.

Because of the many iterations typically required to produce a container meeting the given design specifications, the current container design process is time consuming. Because the process is time consuming, the process is also costly because the company developing the new container design must retain the engineers for their participation in the design process. Therefore, there is a need in the art for an improved container design process.

SUMMARY OF THE INVENTION

The present invention meets the needs described above in a new container design process. As a result of the increased accuracy of this new container design process, fewer prototypes are created and tested. This in turn provides the container design process with the advantages of being faster and cheaper than previous container design processes.

In the new container design process, an engineer prepares container design drawings, typically using CAD/CAM software. The engineer then prepares a unit cavity mold corresponding to the container design drawings. From the unit cavity mold, the engineer then creates a container. Next, the engineer completes a first scan of the container with a scanning device. After the first scan, the engineer subjects the container to expected conditions of use. The engineer then completes a second scan of the container with the scanning device. By comparing the first scan and the second scan, a computer can predict appropriate changes to make to the container design drawings in order to produce a container meeting given design specifications concerning how the container may respond to expected conditions of use.

The comparison between the first scan and the second scan involves calculating changes in wall thickness of the container and changes in container geometry from the first scan to the second scan. Typical scanning devices include magnetic resonance imaging devices, optical scanning devices, and other electromagnetic scanning devices. To use such scanning devices, the engineer may first have to cover the container with a substance detectable by the scanning device. By covering the container surface with microdots of the substance that a computer can separately track from the first scan to the second scan, the computer can calculate the geometric changes in the container resulting from exposure of the container to expected conditions of use.

Generally described, the present invention comprises a method for designing a container. An engineer prepares container design drawings, preferably with CAD/CAM software. The engineer then creates the container from the container design drawings. After completing a first scan of the container with a scanning device, the engineer exposes the container to expected conditions of use. The engineer then completes a second scan of the container with the scanning device. A computer then compares the first scan and the second scan.

By comparing the first scan and the second scan, the computer may determine if the container meets design specifications. If the container does not meet design specifications, the computer may apply finite element analysis to the container using measurements obtained by comparing the first scan and the second scan. Based upon that finite element analysis, the computer may then suggest refinements to the container design drawings that are calculated to produce a container meeting the design specifications. Comparing the first scan and the second scan could also involve calculating location changes, from the first scan to the second scan, of microdots of substance that are placed onto the container and are detectable by the scanning device.

Using the revised container design drawings, the process may be reiterated. Multiple iterations may be necessary to finally produce container design drawings for containers that meet the design specifications.

In one embodiment of the process, the computer determines if measurements of the container obtained from the first scan conform to the container design drawings. If the measurements of the container obtained from the first scan do not conform to the container design drawings, then the process continues by attempting to produce a container that does conform to the container design drawings.

To complete the first scan of the container with the scanning device, an engineer may first coat the container with a substance detectable by the scanning device. The engineer may then scan the container with the scanning device to collect information about wall thickness and container geometry. To coat the container with the substance detectable by the scanning device, the engineer may coat the inside and the outside of the container with the substance. To coat the container with the substance detectable by the scanning device, the engineer may additionally or alternatively coat the container with microdots of the substance that can be separately tracked from the first scan to the second scan.

The present invention also comprises a method for improving a container design. A computer receives container design specifications. The computer also receives readings from a first scan of a container taken before the container has been exposed to expected conditions of use. The computer further receives readings from a second scan of the container taken after the container has been exposed to the expected conditions of use. Using measurements obtained by comparing the first scan and the second scan, the computer applies finite element analysis to the container. Based on the finite element analysis, the computer recommends design changes that will enable the container to meet the container design specifications.

The various aspects of the present invention may be more clearly understood and appreciated from a review of the following detailed description of the disclosed embodiments and by reference to the appended drawings and claims.

DETAILED DESCRIPTION OF EXEMPLARY EMBODIMENTS

The present invention is typically embodied in a container design process. Specifically, an engineer may prepare initial container design drawings, typically using CAD/CAM software and a "best estimate" finite element analysis. The engineer then may prepare a unit cavity mold corresponding to the container design drawings. From the unit cavity mold, the engineer then may create a container. Next, the engineer may complete a first scan of the container with a scanning device. After the first scan, the engineer may subject the container to the expected conditions of use. The engineer then may complete a second scan of the container with the scanning device. By comparing the first scan and the second scan, actual physical measurements of wall surfaces and thicknesses may be provided. A computer then may predict appropriate changes to make to the container design drawings so as to produce a container meeting the given design specifications concerning how the container may respond to the expected conditions of use.

The comparison between the first scan and the second scan involves calculating the changes in the wall thickness of the container and the changes in the container geometry. Typical scanning devices include magnetic resonance imaging devices, optical scanning devices, and other electromagnetic scanning devices. To use such scanning devices, the engineer may first have to cover the container with a substance detectable by the scanning device. By covering the container surface with, for example, small dots of a substance that a computer can track separately from the first scan to the second scan, the computer can calculate the geometric changes in the container resulting from the exposure of the container to the expected conditions of use.

Container Design Process

Figure 1:
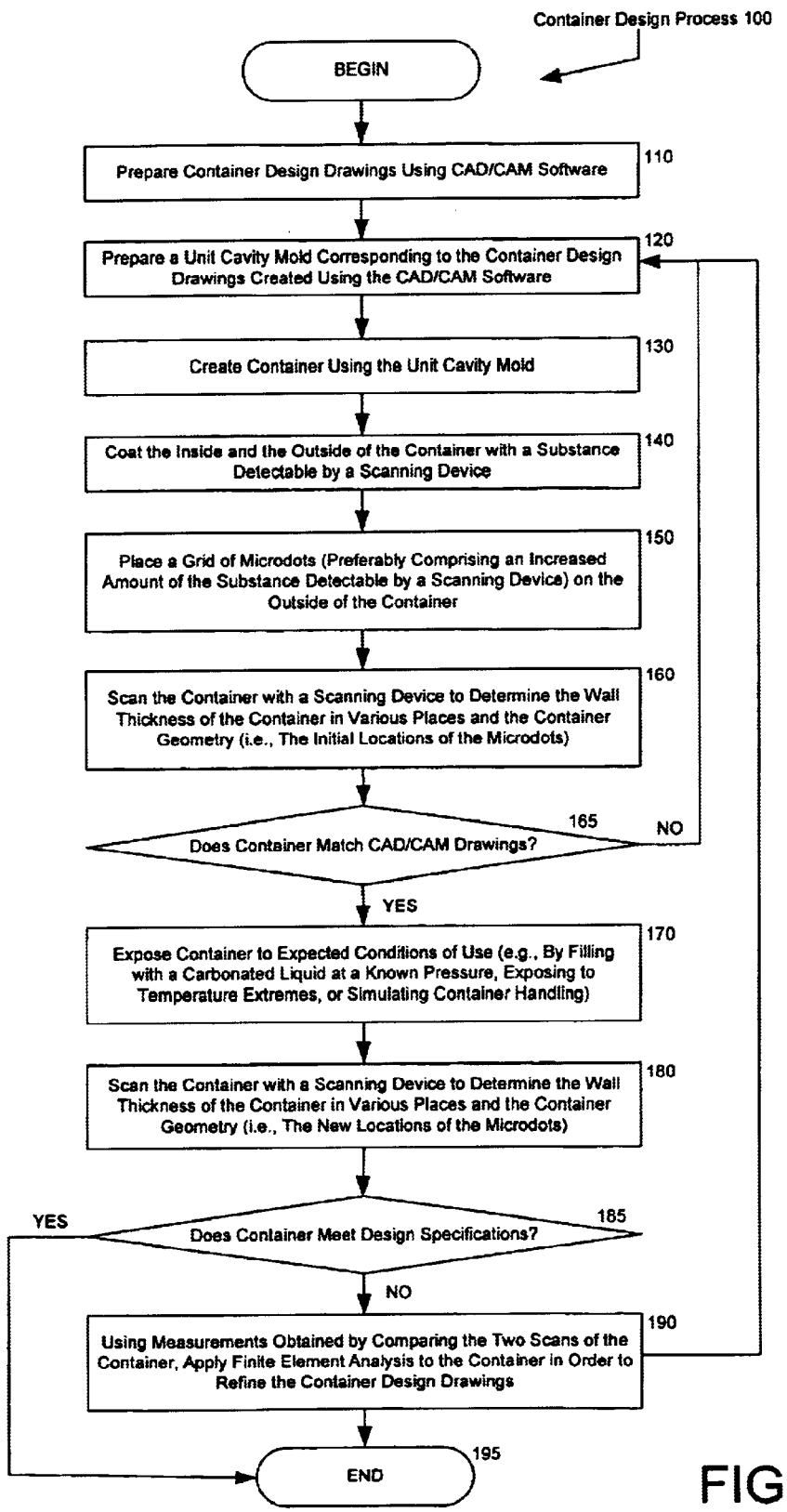
FIG. 1 is a logical flow diagram for a container design process in accordance with an exemplary embodiment of the present invention.
Figure 2:
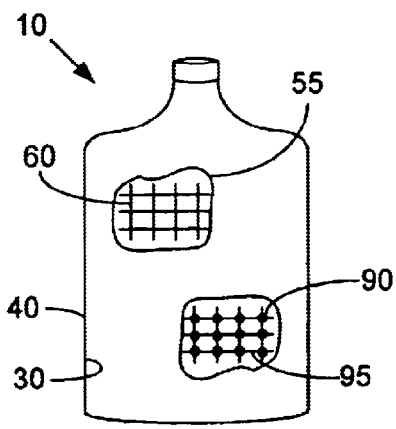
FIG. 2 is a plan view of the container with the layer and the small dots thereon.
Figure 3:
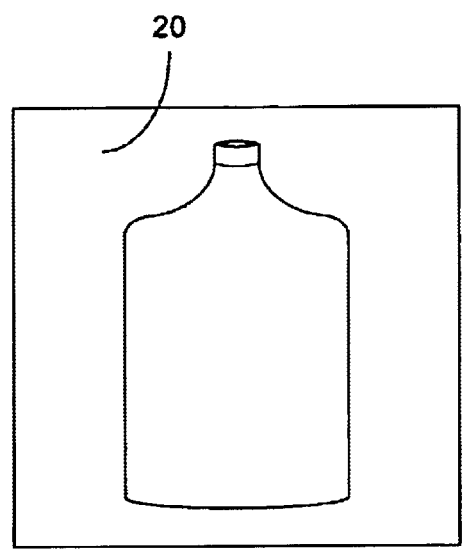
FIG. 3 is a plan view of the mold cavities.
Figure 4:
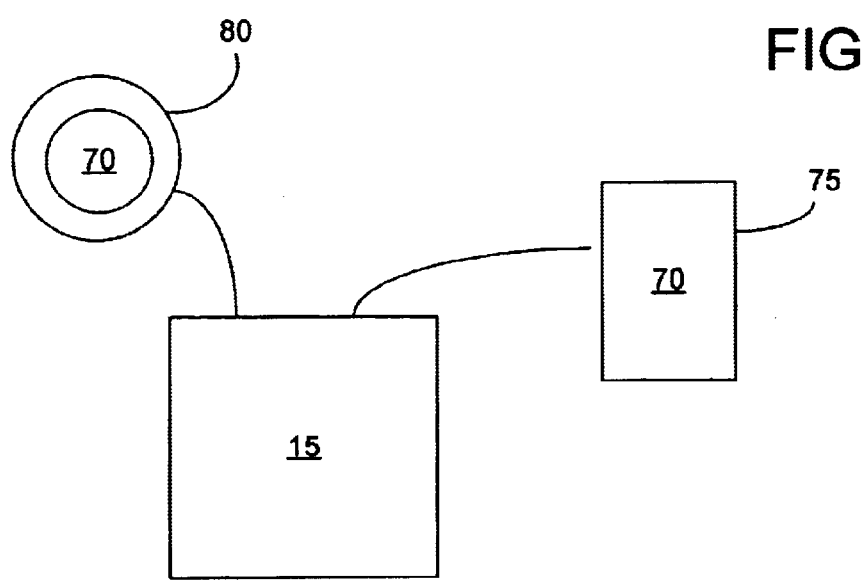
FIG. 4 is a schematic view of the computer, the ring scanner, and the wand scanner.

FIG. 1 is a flow chart illustrating the steps in a typical container design process 100 to develop a container 10 with the use of a computer 15. FIGS. 2–4 show the container 10 and the elements used to design the container 10. The container design process 100 begins with step 110.

In step 110, an engineer prepares container design drawings, preferably using CAD/CAM software. In step 115, the engineer also prepares, based upon the drawings, an estimated finite element analysis which describes the expected geometry of the container under its intended use conditions. As is well known, finite element analysis is a method for solving an equation by approximating continuous quantities as a set of quantities at discrete points, often regularly spaced into a so-called grid or mesh. Because finite element analysis can be adapted to problems of great complexity and unusual geometry, it is useful in the solution of fluid mechanics and mechanical systems issues. Finite element analysis is described in detail in, for example, Spyrakos, C., FINITE ELEMENT MODELING, published by Algor, Inc. of Pittsburgh, Pa., incorporated herein by reference. Numerous Finite Element Analysis software packages also are commercially available. Examples include several packages sold by Algor, Inc. of Pittsburgh, Pa. and Adina R & D, Inc. of Watertown, Mass.

In step 120, the engineer prepares a unit cavity mold 20 that corresponds to the container design drawings. Methods for preparing the unit cavity mold 20 from the container design drawings are well known to those skilled in the art. In step 130, the engineer creates the container 10 using the unit cavity mold 20 by blow molding or other manufacturing means known to those skilled in the art.

In step 140, the engineer coats an inside surface 30 and an outside surface 40 of the container 10 with a coating 55 of a substance 60 detectable by a scanning device 70. Although the scanning device 70 may not be able to detect directly the surfaces 30, 40 of the container 10, the scanning device 70 can detect the locations of the substance 60 chosen to coat the inside 30 and the outside surface 40 of the container 10. From this information, the scanning device 70 can indirectly determine the locations of the container surfaces 30, 40 and the thickness of the container wall, i.e., the difference between the locations of the container surfaces 30, 40. Selection of the appropriate substance 60 for the coating 55 on the container 10 will therefore depend on the scanning device 70 to be used in the process.

Those skilled in the art should be familiar with a multitude of scanning devices 70 appropriate for the purposes of the present invention. Such scanning devices 70 include, but are not limited to, magnetic resonance imaging (MRI) devices, other electromagnetic scanning devices, and optical scanning devices.

The scanning device 70 may include a wand scanner 75. The scanning device 70 alternatively may include a ring scanner 80. A combination of scanning devices 70 may be used to complete a scan of the container 10. For example, the wand scanner 75 inserted into the container 10 can detect the coating 55 of the substance 60 on the inside surface 30 of the container 10 and the ring scanner 80 surrounding the outside surface 40 of the container 10 can detect the substance 60 on the outside surface 40 of the container 10. However, a single scanning device 70 could detect the coating 55 of the substance 60 on both the inside surface 30 and the outside surface 40 of the container 10.

Those skilled in the art also should be familiar with the appropriate substances 60, which, if needed, are available for use with a particular scanning device 70. If the scanning device 70 includes a magnetic resonance imaging device, for example, then the substance 60 may include magnetic particles such as iron ions. If the scanning device 70 includes an optical or a laser-scanning device, then the substance 60 may be reflective or refractive coating detectable by the particular optical scanning device 70. Some optical scanning devices 70 may not require that the container 10 be coated with any particular substance 60 in order to be successfully scanned.

After the engineer coats the inside surface 30 and the outside surface 40 of the container 10 with the substance 60 detectable by the scanning device 70, step 150 is executed. In step 150, the engineer places a grid of the small dots 90 on the outside surface 40 of the container 10. These small dots 90 are preferably individually distinguishable from the coating 55 of the substance 60, which may be more uniform and uninterrupted, of step 140. Preferably, these small dots 90 comprise an increased amount or concentration of the substance 60 used in step 140. To help distinguish the small dots 90 from the coating 55 of the substance 60 of step 140, however, the small dots 90 may instead include a different substance 60 detectable by the scanning device 70 than the substance 60 applied in step 140.

The engineer affixes the small dots 90 to the container 10 such that the engineer may arrange the small dots 90 sequentially in a manner that renders, but is not limited to, a grid or a mesh 95. The grid or the mesh 95 therefore corresponds to the grid or the mesh system that is integral to conventional finite element analysis. Because the engineer can repeat identical sequential traversal of the small dots 90 or the mesh 95 at a later time, these small dots 90 or the mesh 95 allow the engineer to track the locations of specific points on the container 10 from scan to scan, even though the container 10 may have become deformed in the interim. The small dots 90 or the mesh 95 therefore may enable the engineer to track deformities in the container 10 occurring between scans from exposure of the container 10 to the expected conditions of use.

In step 160, the engineer completes a first scan of the container 10 with the scanning device 70. The data recorded during this first scan can be digitally stored in the computer 15. The computer 15 may calculate the wall thickness of the container 10 in various locations using the data recorded during the first scan. This may be done, for example, by calculating the difference between the nearest point on the coating 55 on the outer surface 40 to a fixed point of the scanning device 70 and the nearest point on the coating 55 of the inner surface 30 to the fixed point of the scanning device 70.

From the data recorded during the first scan, the computer 15 also can determine the initial geometry of the container 10. In other words, the computer 15 may determine the initial locations of each of the small dots 90 or the mesh 95 relative to the scanning device 70.

In step 165, the computer compares the container wall thickness calculations and the container wall geometry to the CAD/CAM drawings to determine if the drawings have been accurately embodied in the container 10. If the container 10 does not match the CAD/CAM drawings, then the "NO" branch is followed to step 120 to attempt again to reproduce accurately the CAD/CAM drawings in a prototypical container. Referring still to step 165, if the container 10 does match the CAD/CAM drawings, then the "YES" branch is followed to step 170.

In step 170, the engineer exposes the container 10 to the expected conditions of use for the container 10. To replicate the expected conditions of use, the engineer may, for example, fill the container 10 with a carbonated liquid at a known pressure, expose the container 10 to an internal vacuum, expose the container 10 to temperature extremes, or simulate the handling that the container 10 would experience during shipment to a consumer. The pressure may be greater than atmospheric. During extensive testing, the engineer may subject the container 10 to combinations of these and other expected conditions of use.

In step 180, the engineer completes a second scan of the container 10 with the scanning device 70. The data recorded during this second scan also can be digitally stored in the computer 15. Using the data recorded during the second scan, the computer 15 again can calculate the wall thickness of the container 10 in various locations and the new container geometry (i.e., the new locations of the small dots 90, or the new locations of the nodes that make up the mesh 95). Because of the exposure of the container 10 to the expected conditions of use in step 170, the wall thickness of the container 10 and the new container geometry are likely to be different from that found in step 160.

In step 185, the computer 15 examines the wall thickness of the container 10 determined by the second scan and the new locations of the small dots 90, or the new locations of the nodes of the mesh 95, relative to the initial locations of the small dots 90 or the nodes of the mesh 95. Also, the engineer may make visual observations to determine the cause of the failure, if any, of the container 10. From this examination, the computer 15 may be used to determine if the container 10 meets the predetermined design specifications, including performance requirements. If the container 10 meets the predetermined design specifications, then the "YES" branch is followed to step 195, and the container design process 100 ends because the container design drawings are now optimized. If the computer 15 determines in step 185 that the container 10 does not meet the predetermined design specifications, then the "NO" branch is followed to step 190.

In step 190, the computer 15 may make improvements to the initial finite element analysis of the container 10. The calculations may be based upon the commercially available Finite Element Analysis software described in detail above. The use of such software is considered to be with the ability of one of ordinary skill in the art. The actual finite element analysis techniques embodied in the software is not considered essential to the present invention. The computer 15 may do this initial analysis by using computations derived from the two scans of the container 10 as the input into the finite element analysis equations. These computations may include the wall thickness computations and the movement of the small dots 90 or the nodes of the mesh 95 from their initial locations (as determined by the first scan) to their new locations (as determined by the second scan). The actual physical measurements and the location changes of the small dots 90 or nodes of the mesh 95 of the container 10 after it has been exposed to its intended use may be used. This information may correspond to the nodes of the mathematical mesh of the finite element analysis. The computer 15 may then generate an improved finite element analysis by having verified dimensions for the equations that describe the container geometry and the dimensional behavior that could be expected when the container 10 is put under the expected conditions.

In Step 200, after running the improved finite element analysis, the computer 15 may then recommend changes to the container geometry and the associated design drawings that should enable the container 10 produced from those drawings to meet design specifications. The computer 15 may automatically make those changes to the container design drawings.

The process then repeats from step 120, where the engineer prepares a unit cavity mold 20, or modifies the previous mold 20, that corresponds to the refined container design drawings. The procedures and the provisions of the above process thus provides the physical verifications for the improvement of the initial finite element analysis that is used to describe the geometry and the behavior of the geometry of the container after exposing the container to its intended use.

Automation of the Container Design Process

The steps of the container design process 100 may be automated under the control of the computer 15. Alternatively, a human may perform some steps and leave other steps, such as digitally storing the information from the two scans of the container 10 and performing calculations on that information, to the computer 15.

The computer 15 may have typical features of a computer system, such as a processing unit, a system memory containing random access memory (RAM) and read only memory (ROM), and a system bus that couples the system memory to the processing unit. The computer 15 also may include various memory storage devices, such as a hard disk drive, a magnetic disk drive (e.g., to read from or write to a removable magnetic disk), and an optical disk drive (e.g., to read from or write to optical media such as a CD-ROM).

A number of program modules may be stored in the drives and RAM of the computer 15. Program modules control how the computer 15 functions and interacts with the user, with input/output devices, or with other computers 15. Program modules include routines, an operating system, application program modules, data structures, browsers, and other software or firmware components. The present invention may conveniently be implemented in various program modules that are stored on the drives of the computer 15 and implement the methods described in the detailed description.

No particular programming language will be described for carrying out the various procedures described in the detailed description because it is considered that the operations, steps, and procedures described and illustrated in the accompanying drawings are sufficiently disclosed to permit one of ordinary skill in the art to practice an exemplary embodiment of the present invention. Moreover, there are many computers and operating systems that may be used in practicing an exemplary embodiment, and therefore no detailed computer program could be provided which would be applicable to all of these many different systems. Each user of a particular computer 15 will be aware of the language and tools which are most useful for that user's needs and purposes.

CONCLUSION

The detailed description has described a container design process. Other alternative embodiments will become apparent to those skilled in the art to which an exemplary embodiment pertains without departing from its spirit and scope. Accordingly, the scope of the present invention is defined by the appended claims rather than the foregoing description.

I claim:

1. A method for designing a container, comprising:
    a) preparing container design drawings;
    b) creating the container from the container design drawings;
    c) completing a first scan of the container with a scanning device;
    d) exposing the container to expected conditions of use;
    e) completing a second scan of the container with the scanning device;
    f) comparing the first scan and the second scan; and
    g) applying the compared scans to the design of the container.

2. The method of claim 1, wherein comparing the first scan and the second scan comprises determining if the container meets design specifications.

3. The method of claim 2, wherein comparing the first scan and the second scan further comprises:
    if the container does not meet the design specifications,
        applying finite element analysis to the container using measurements obtained by comparing the first scan and the second scan; and
        based upon the finite element analysis, refining the container design drawings in a manner calculated to produce a container meeting the design specifications.

4. The method of claim 3, further comprising if the container does not meet the design specifications, then repeating "b" through "g" until the container does meet the design specifications.

5. The method of claim 1, wherein preparing container design drawings comprises preparing container design drawings using CAD/CAM software.

6. The method of claim 1, wherein creating the container from the container design drawings comprises:
    preparing a unit cavity mold corresponding to the container design drawings; and
    creating the container from the unit cavity mold.

7. The method of claim 1, wherein exposing the container to expected conditions of use comprises filling the container with a beverage expected to be carried by the container when mass marketed.

8. The method of claim 7, wherein the beverage comprises a carbonated liquid.

9. The method of claim 8, wherein filling the container with the beverage expected to be carried by the container when mass marketed comprises filling the container with the carbonated liquid under a pressure at which the carbonated liquid will be bottled when mass marketed.

10. The method of claim 7, wherein the beverage comprises a hot liquid.

11. The method of claim 7, wherein the beverage comprises a non-carbonated liquid under vacuum.

12. The method of claim 7, wherein the beverage comprises a non-carbonated liquid under greater than atmospheric pressure.

13. The method of claim 1, wherein exposing the container to expected conditions of use comprises exposing the container to temperature extremes.

14. The method of claim 1, wherein exposing the container to expected conditions of use comprises simulating handling conditions that could be experienced by the container during transport to a consumer.

15. The method of claim 1, further comprising:
    determining if measurements of the container obtained from to first scan conform to the container design drawings; and
    if the measurements of the container obtained from the first scan do not conform to the container design drawings, then returning to step "b."

16. The method of claim 1, wherein completing the first scan of the container with the scanning device comprises:

coating the container with a substance detectable by the scanning device; and scanning the container with to scanning device to collect information about wall thickness and container geometry.

17. The method of claim 16, wherein coating the container with the substance detectable by the scanning device comprises coating an inside and an outside of the container with the substance.

18. The method of claim 16, wherein coating the container with the substance detectable by the scanning device comprises coating the container with microdots of the substance that can be separately tracked from the first scan to the second scan.

19. The method of claim 1, wherein comparing the first scan and the second scan comprises calculating location changes, from the first scan to the second scan, of microdots of substance that are placed onto the container and are detectable by the scanning device.

20. The method of claim 1, wherein the scanning device comprises a magnetic resonance waging scanner.

21. The method of claim 1, wherein the scanning device comprises an optical scanner.

22. The method of claim 1, wherein the scanning device comprises a ring scanner.

23. The method of claim 1, wherein the scanning device comprises a wand scanner.

24. A method for improving a container design, comprising:

receiving container design specifications;

receiving readings from a first scan of a container taken before the container has been exposed to expected conditions of use;

receiving readings from a second scan of the container taken alter the container has been exposed to the expected conditions of use;

using measurements obtained by comparing the first scan and the second scan, applying finite element analysis to the container;

based on the finite element analysis, recommending design changes that will enable the container to meet the container design specifications.

25. A computer-readable medium having computer-executable instructions for performing the method of claim 24.

26. A computer system adapted to perform the method of claim 24.

* * * * *